(12) United States Patent
Zhou et al.

(10) Patent No.: US 11,060,177 B2
(45) Date of Patent: Jul. 13, 2021

(54) PREPARATION OF REFLECTIVE IMAGE COMPONENT AND APPLICATION METHOD THEREOF

(71) Applicant: SUN YAT-SEN UNIVERSITY, Guangzhou (CN)

(72) Inventors: Zhangkai Zhou, Guangzhou (CN); Jiancai Xue, Guangzhou (CN); Zhiqiang Wei, Guangzhou (CN)

(73) Assignee: SUN YAT-SEN UNIVERSITY, Guangzhou (CN)

( * ) Notice: Subject to any disclaimer, the term of this patent is extended or adjusted under 35 U.S.C. 154(b) by 621 days.

(21) Appl. No.: 15/730,722

(22) Filed: Oct. 11, 2017

(65) Prior Publication Data

US 2018/0100229 A1    Apr. 12, 2018

(30) Foreign Application Priority Data

Oct. 12, 2016    (CN) .......................... 201610891784.0

(51) Int. Cl.
*C23C 14/34*    (2006.01)
*C23C 14/02*    (2006.01)
(Continued)

(52) U.S. Cl.
CPC .......... *C23C 14/021* (2013.01); *C23C 14/185* (2013.01); *C23C 14/34* (2013.01); *C25D 11/10* (2013.01); *C25D 11/12* (2013.01); *C25D 11/16* (2013.01); *C25D 11/24* (2013.01); *C25F 3/20* (2013.01); *G03F 7/70* (2013.01)

(58) Field of Classification Search
None
See application file for complete search history.

(56) References Cited

U.S. PATENT DOCUMENTS

| 2002/0109134 A1* | 8/2002 | Iwasaki | G11B 5/74 |
| | | | 257/13 |
| 2006/0216603 A1* | 9/2006 | Choi | H01M 4/1391 |
| | | | 429/231.95 |
| 2012/0196090 A1* | 8/2012 | Isurugi | C25D 11/12 |
| | | | 428/156 |

FOREIGN PATENT DOCUMENTS

| CN | 101306794 A | * 11/2008 |
| CN | 101398618 A | 4/2009 |

(Continued)

OTHER PUBLICATIONS

Translation to Li (CN 101306794) published Nov. 2008. (Year: 2008).*

(Continued)

*Primary Examiner* — John J Brayton

(57) ABSTRACT

The present invention discloses preparation of a reflective image component and application method thereof. A reflective image component in the present invention consists of a metallic semi-continuous thin film, a porous alumina film and a high reflective metal substrate. The structure is easy in preparation, low in cost, environmental friendly regarding preparing procedures and suitable for large-scale fabrication, which plays a significant role in developing a next generation of image component; the minimum pixel in the image obtained is able to reach nano level, much smaller than the pixel in most of the self-luminous screens at present; the image also provides the ability of reversible color transformations, which can be applied to information encryption and trademark decoration and the like.

5 Claims, 5 Drawing Sheets

(51) Int. Cl.
      *C25D 11/16*       (2006.01)
      *C25D 11/24*       (2006.01)
      *C25D 11/10*       (2006.01)
      *C23C 14/18*       (2006.01)
      *C25D 11/12*       (2006.01)
      *C25F 3/20*        (2006.01)
      *G03F 7/20*        (2006.01)

(56) References Cited

FOREIGN PATENT DOCUMENTS

| | | | |
|---|---|---|---|
| CN | 102634835 A | * | 8/2012 |
| CN | 103243368 A | | 8/2013 |
| CN | 104264202 A | | 1/2015 |
| JP | 59-89794 A | | 5/1984 |

OTHER PUBLICATIONS

Translation to Peng (CN 102634835) published Aug. 2012 (Year: 2012).*
Lee, Woo, et al. Fast fabrication of long-range ordered porous alumina membranes by hard anodization, Max Planck Institute of Microstructure Physics, Nature Materials Aug. 20, 2006, vol. 5 (p. 741-747).*
Biao Wang et al.,"Preparation of photonic crystals made of air pores in anodic alumina",Nanotachnology, Aug. 10, 2007.
Takashi Yanagishita,"Facile preparation of porous alumina through-hole masks for sputtering by two-layer anodization",AIP Advances,Aug. 11, 2016.

* cited by examiner

PREPARATION OF REFLECTIVE IMAGE COMPONENT AND APPLICATION METHOD THEREOF

TECHNICAL FIELD

The present invention relates to a technology field of image component and especially to a preparation of a reflective image component and an application method thereof.

BACKGROUND

Reflective image component has been considered as a next generation of image component. At present, the mainstream of reflective image component has originated in 2012. Joel K. W. Yang et al., from Singapore, who utilizes a difference of plasmon resonance of metallic nanodisks with different shapes in light scattering ability in different wavelengths, to prepare a reflective image component whose resolution reaches the optical diffraction limit. A reflective image obtained from the said reflective image component provides a super small pixel, a super high image durability as well as a super large information capacity, and has drawn an extensive public attention. This attention has significantly motivated the development of a preparing process for a reflective image component and also significantly motivated the extension of its applicable fields. However, the said method for preparing the component mostly relies on electron beam lithography which involves a large and complex physical equipment. Therefore, problems occur such as a high preparation cost, a complex operation process flow, as well as a small image area, which significantly impose a restriction on popularizing an application of reflective image component.

SUMMARY

In order to overcome the deficiency of the present technology, the present invention provides a preparation of a reflective image component and an application method thereof. Through this method, a large amount of reflective image components can be prepared with an easy operation, a low cost, a high efficiency and excellent image durability.

The technical solutions adopted in the present invention in order to solve the prior technical problems are shown as follows.

A method for preparing a reflective image component comprises:

a. cleaning of an aluminum sheet: soaking an aluminum sheet with a thickness of more than 0.1 mm in acetone for 5~15 mins; then soaking the aluminum sheet in the 0.5~1.5 mol/L sodium hydroxide solution for 5~15 mins, and finally soaking the aluminum sheet in ethanol for 5~15 mins;

b. polishing of an aluminum sheet: putting the soaked aluminum sheet into a mixed solution of perchloric acid and ethanol with 15%~35% of perchloric acid to ethanol (v/v), electrochemical polishing the aluminum sheet under a voltage of 10~30 volts for 2~6 mins under 0~4° C.;

c. a first oxidation of an aluminum sheet: putting the polished aluminum sheet into an electrolyte pool with 0.1~0.3 mol/L oxalic acid; the aluminum sheet is used as an anode and the platinum sheet is used as a cathode; a growth voltage is 30~50 volts, oxidation time is 2~8 hours, and an oxidation temperature is 4~8° C.;

d. etching of an aluminum sheet: putting the first oxidized aluminum sheet into a mixture of chromic acid, phosphoric acid and water for 60~90 mins under 45~75° C.;

e. a second oxidation of the aluminum sheet: putting the etched aluminum sheet into the electrolyte pool with 0.1~0.3 mol/L oxalic acid solution, the aluminum sheet is used as an anode and the platinum sheet is used as a cathode, an oxidation voltage is 30~50 volts, the oxidation time is 80~600 s, and the oxidation temperature is 4~8° C.;

f. exposing of an image by photolithography: spin-coating a photoresist in advance on the surface of a porous aluminum template formed after the second oxidation of an aluminum sheet, and then exposing an image by a photolithography system;

g. modulation of a pore diameter of the porous alumina template: putting a photolithography-exposed aluminum template into 0.3 mol/L oxalic acid solution, keeping a temperature at 40~60° C., soaking for 0~360 mins to obtain a porous alumina template with a first pore diameter, and removing the photoresist and changing the first pore diameter of the porous alumina template to enlarging the first pore diameter into a second pore diameter; and h. sputtering of a thin film: using a metal target material to sputter a thin film on the porous alumina template by a sputtering device, to obtain the reflective image component; a sputtering current is 3~100 mA and sputtering time is 50~300 seconds.

Further, a mass fraction of the chromic acid in the mixture in the step d is 1~3%, a mass fraction of the phosphoric acid in the step d is 4~8% and a balance is water.

Further, a thickness of the porous alumina template in the step f is 200~1000 nm.

Further, the target material provided in the sputtering device in the step h is a gold target, a silver target or an aluminum target.

Further, the sputtered thin film consists of a metallic semi-continuous film, a porous alumina film and a high reflective metal substrate. At the same time, an image output is formed since there is a color difference between a photoresist covered area and a photoresist non-covered area in a reflective image component.

The present invention further discloses an application method for a reflective image component. The reflective image component is obtained using the preparation method for a reflective image component, and dielectric materials such as PMMA or PDMS are added in the porous alumina template of the reflective image component, so that image information of the reflective image component is invisible to achieve purpose of information encryption.

Compared to the prior art, the present invention has advantages and benefits as follows.

1. The metallic semi-continuous film, the porous alumina film as well as the high reflective metal substrate in the reflective image component provide advantages such as a simple operation, a low cost, an environmental friendly preparation, a large sample area and the like, which is able to play an important role in development and preparation of the next generation of image component.

2. The minimum pixel obtained by the reflective image component in the present invention is able to reach nano level, which is much smaller than the minimum pixel of most of the self-luminous screens at present.

3. The image of the reflective image component in the present invention has the ability of reversible color transformations, and is able to apply to information encryption and trademark decoration and the like.

DETAILED DESCRIPTION

A further description of the present invention is provided with embodiments as follows. Figures are only for example illustration but not understood as the limitation to the present invention; in order to describe embodiments better, some parts in figures is omitted, zoomed in or zoomed out. It is understandable for those skilled in art that some common general structure and description thereof can be omitted from the drawings.

Embodiment 1

Figure 1:
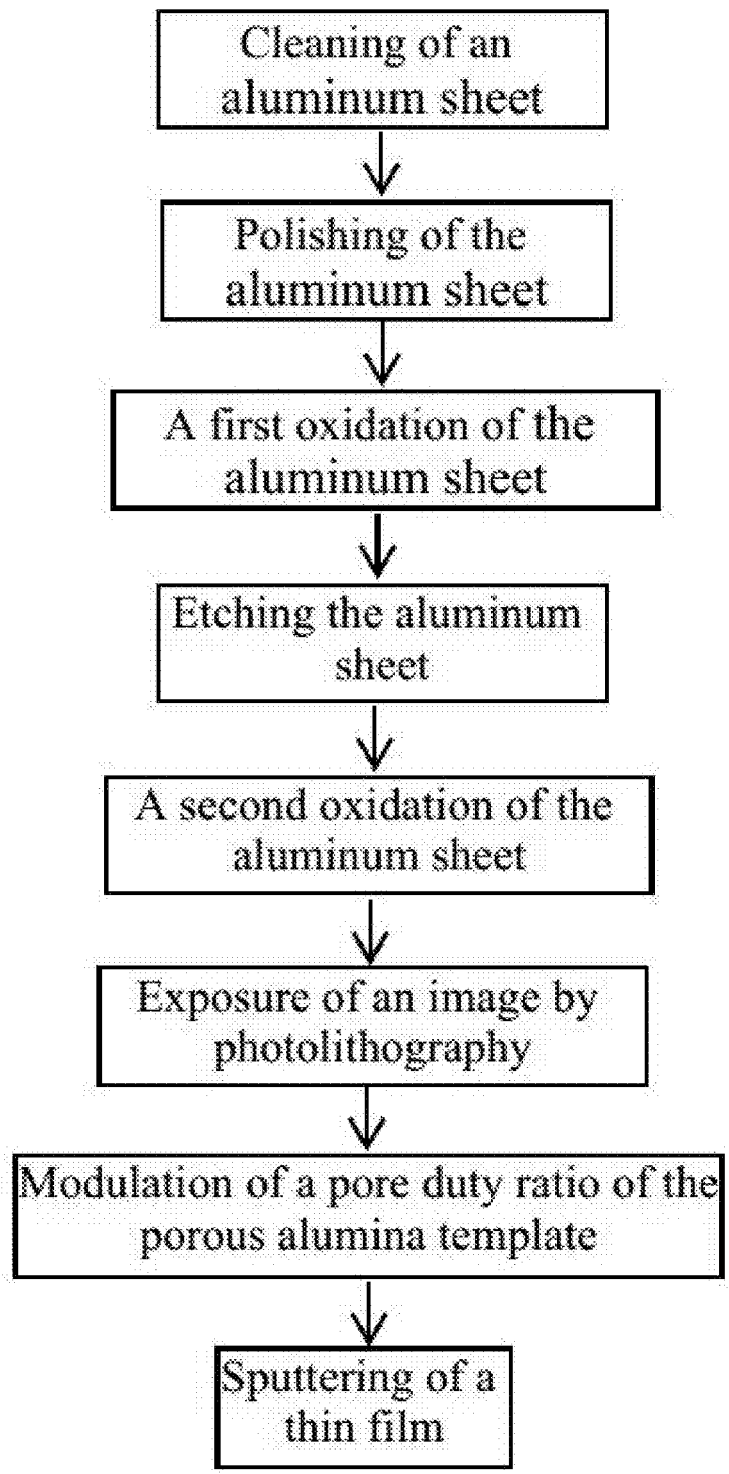
FIG. 1 shows a flow diagram of a preparation method for the present invention.

As shown in FIG. 1, a method for preparing a reflective image component comprises: a. cleaning of an aluminum sheet: soaking an aluminum sheet with a thickness of more than 0.1 mm in acetone for 5~15 mins; then soaking the aluminum sheet in the 0.5~1.5 mol/L sodium hydroxide solution for 5~15 mins, and finally soaking the aluminum sheet in ethanol for 5~15 mins;

b. polishing of an aluminum sheet: putting the soaked aluminum sheet into a mixed solution of perchloric acid and ethanol with 15%~35% of perchloric acid to ethanol (v/v), electrochemical polishing the aluminum sheet under a voltage of 10~30 volts for 2~6 mins under 0~4° C.;

c. a first oxidation of an aluminum sheet: putting the polished aluminum sheet into an electrolyte pool with 0.1~0.3 mol/L oxalic acid; the aluminum sheet is used as an anode and the platinum sheet is used as a cathode; a growth voltage is 30~50 volts, oxidation time is 2~8 hours, and an oxidation temperature is 4~8° C.;

d. etching of an aluminum sheet: putting the first oxidized aluminum sheet into a mixture of chromic acid, phosphoric acid and water for 60~90 mins under 45~75° C.;

e. a second oxidation of the aluminum sheet: putting the etched aluminum sheet into the electrolyte pool with 0.1~0.3 mol/L oxalic acid solution, the aluminum sheet is used as an anode and the platinum sheet is used as a cathode, an oxidation voltage is 30~50 volts, the oxidation time is 80~600 s, and the oxidation temperature is 4~8° C.;

f. exposing of an image by photolithography: spin-coating a photoresist in advance on the surface of a porous aluminum template formed after the second oxidation of an aluminum sheet, and then exposing an image by a photolithography system;

g. modulation of the pore diameter of the porous alumina template: putting a photolithography-exposed aluminum template into 0.3 mol/L oxalic acid solution, keeping a temperature at 40~60° C., soaking for 0~360 mins to obtain a porous alumina template with a first pore diameter, and removing the photoresist and changing the first pore diameter of a porous alumina template to enlarging the first pore diameter into a second pore diameter; and h. sputtering of a thin film: using a metal target material to sputter a thin film on the porous alumina template by a sputtering device, to obtain the reflective image component; a sputtering current is 3~100 mA and sputtering time is 50~300 seconds.

Further, a mass fraction of the chromic acid in the mixture in the step d is 1~3%, a mass fraction of the phosphoric acid in the step d is 4~8% and a balance is water.

Further, a thickness of the porous alumina template in the step f is 200~1000 nm.

Further, the target material provided in the sputtering device in the step h is a gold target, a silver target or an aluminum target.

Further, the sputtered thin film consists of a metallic semi-continuous film, a porous alumina film and a high reflective metal substrate. At the same time, an image output is formed since there is a color difference between a photoresist covered area and a photoresist non-covered area in a reflective image component.

The present invention further discloses an application method for a reflective image component. The reflective image component is obtained using the preparation method for a reflective image component, and dielectric materials such as PMMA or PDMS are added in the porous alumina template of the reflective image component, so that image information of the reflective image component is invisible to achieve purpose of information encryption.

In the present embodiment, an aluminum sheet with a thickness of 0.2 cm is soaked successively in acetone, in 1.5 mol/L sodium hydroxide solution and in ethanol solution for 15 mins respectively, and the ethanol-soaked aluminum sheet is added in a solution of perchloric acid to alcohol ratio of 0.3 (v/v). Electrochemical polishing is performed to the sheet for 6 mins in voltage of 20V. Aluminum sheet is connected with an anode and platinum sheet is used as a cathode, and the polishing temperature is 0° C.

After polishing, the aluminum sheet is anodized for the first time; the electrolyte is 0.3 mol/L oxalic acid solution; a growth voltage is 45V; the aluminum plate is connected with the anode; the platinum plate is used as cathode; the oxidation time is 4~8 hours; and the reaction temperature is 4° C. After the first oxidation, the aluminum sheet is added into a mixed solution of chromic acid, phosphoric acid and distilled water (a mass fraction of chromic acid is 1.8% and a mass fraction of phosphoric acid is 6%) to keep the sheet at 60° C. for 60 mins, and the alumina produced at the first oxidation is removed. And then a regular alumina template is formed by reacting again for 180 seconds in same condition of the first anodic oxidation.

Figure 2:
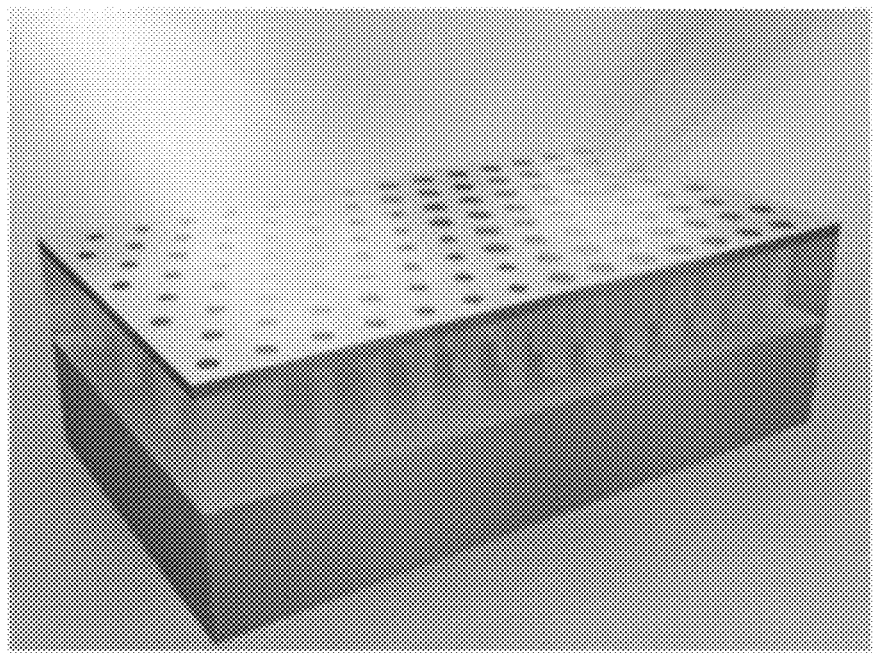
FIG. 2 shows a structural view of a thin film of a reflective image component in embodiment 1 of the present invention.
Figure 3:
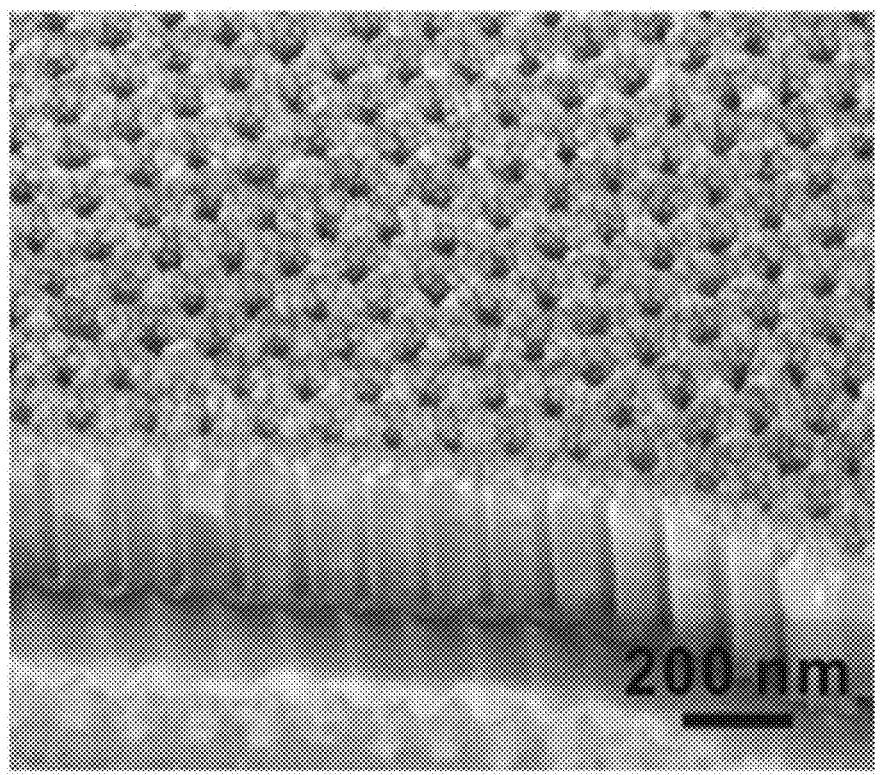
FIG. 3 shows a surface topographic view of a reflective image component in embodiment 1 of the present invention.

As shown in FIG. 2 and FIG. 3, the reacted alumina template is taken into the sputtering device and sputtered for 250 s using a 3 mA current, and Ag is selected as a sputtering target. A sandwich structure with a metal particle semi-continuous film, a porous alumina film and a metallic high reflective layer is formed.

To regulate a pore diameter of the alumina template, that is, the alumina sheet is soaked in 0.3 mol/L oxalic acid solution before sputtering a metal, and a temperature is maintained at 45° C., and a soaking time is 0~140 mins. The whole visible area is presented vividly in full color by the said structure and the presented color is introduced into the CIE 1931 color space. It is found that points which present the color wavelengths of the sample can surround the white dot center and form a circle, proving that our structure can complete a full color output.

Embodiment 2

In the present embodiment, an aluminum sheet with a thickness of 0.2 cm is soaked successively in acetone, in 1.5 mol/L sodium hydroxide solution and in ethanol solution for 15 mins respectively, and the ethanol-soaked aluminum sheet is added into a solution of perchloric acid to alcohol ratio of 0.3 (v/v). Electrochemical polishing is performed to the sheet for 6 mins in a voltage of 20V. Aluminum sheet is connected with an anode, platinum sheet is used as a cathode, and the polishing temperature is 0° C.

After polishing, the aluminum sheet is anodized for the first time; the electrolyte is 0.3 mol/L oxalic acid solution; a growth voltage is 45V; the aluminum plate is connected with the anode; the platinum plate is used as the cathode; the oxidation time is 4~8 hours; and the reaction temperature is 4° C. After the first oxidation, the aluminum sheet is added into a mixed solution of chromic acid, phosphoric acid and distilled water (a mass fraction of chromic acid is 1.8% and a mass fraction of phosphoric acid is 6%) to keep the sheet at 60° C. for 60 mins, and the alumina produced at the first oxidation is removed. And then a regular alumina template is formed by reacting again for 180 seconds in the same condition of the first anodic oxidation.

S1805 photoresist is spin-coated on the surface of the alumina template. The speed of coating is 3000 r.p.m. After the spin-coating, the alumina template is taken into ultraviolet laser writing system for exposing, and the desired image is developed with 2.38% TMAH. The exposed sample is soaked into 0.3 mol/L oxalic acid solution for 40 mins, a temperature is maintained at 45° C. The alumina template is taken out, and the photoresist is removed. The template is added into 0.3 mol/L oxalic acid solution for 40 mins for the second time, a temperature is maintained at 45° C. Different duty ratios of alumina template between the photoresist-covered area and non-photoresist-covered are formed by soaking the template twice, so as to lay a foundation for forming different colors after sputtering a metal.

After being subjected to two times of pore enlarging treatment, the alumina template is put in a sputtering device, and aluminum is chosen as a sputtering target. Sputtering current is 100 mA and sputtering time is 100 s to form bright image input. Since the alumina template has a porous structure, it is possible to further regulate a color input even after preparation of an image. Ethanol is added to the alumina template surface, and a color of the image changes significantly after ethanol completely enters pores of the alumina template, which demonstrates a color changing ability of our sample.

Embodiment 3

In the present embodiment, an aluminum sheet with a thickness of 0.2 cm is soaked successively in acetone, in 1.5 mol/L sodium hydroxide solution and in ethanol solution for 15 mins respectively, and the ethanol-soaked aluminum sheet is put in a solution of perchloric acid to alcohol ratio of 0.3 (v/v). Electrochemical polishing is performed to the sheet for 6 mins in voltage of 20V. Aluminum sheet is connected with an anode, platinum sheet is used as cathode, and the polishing temperature is 0° C.

After polishing, the aluminum sheet is anodized for the first time; the electrolyte is 0.3 mol/L oxalic acid solution; a growth voltage is 45V; the aluminum plate is connected with the anode; the platinum plate is as cathode; the oxidation time is 4~8 hours; and the reaction temperature is 4° C. After the first oxidation, the aluminum sheet is added into a mixed solution of chromic acid, phosphoric acid and distilled water (a mass fraction of chromic acid is 1.8% and a mass fraction of phosphoric acid is 6%) to keep at 60° C. for 60 mins, and the alumina produced at the first oxidation is removed. And then a regular alumina template is formed by reacting for 180 seconds in the condition of the first anodic oxidation.

S1805 photoresist is spin-coated on the surface of the alumina template evenly. The speed of coating is 3000 r.p.m. The alumina template is put into ultraviolet laser writing system for exposing, and the desired image is developed with 2.38% TMAH. The exposed sample is then soaked into 0.3 mol/L oxalic acid solution for 2.5 mins, and a temperature is maintained at 45° C. The alumina template is taken out, and the photoresist is removed. The template is added into 0.3 mol/L oxalic acid solution for 40 mins for the second time, and a temperature is maintained at 45° C.

Figure 4:
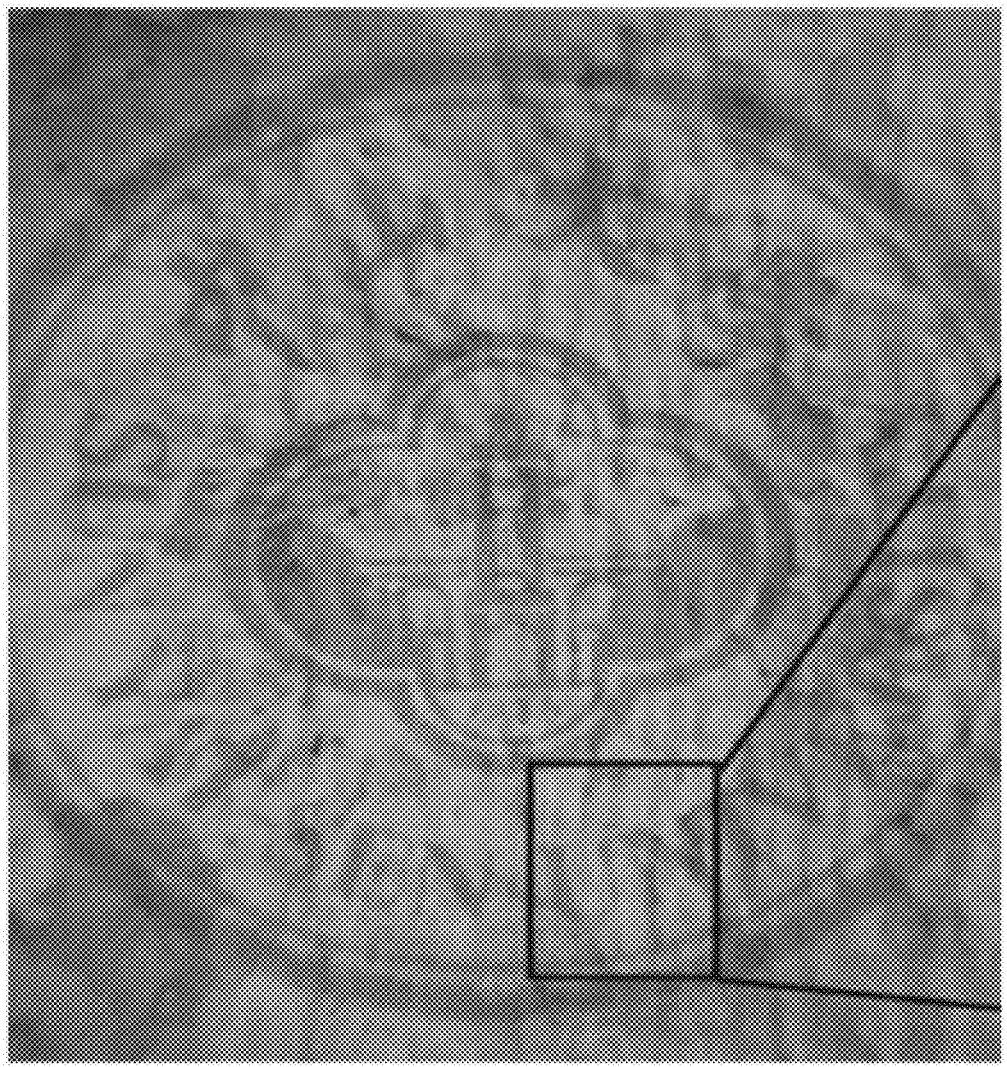
FIG. 4 shows a display view of image obtained from a reflective image component in embodiment 3 of the present invention.
Figure 5:
FIG. 5 shows a partial enlargement view of FIG. 4.

A two-reamed alumina template is put in a sputtering device, choosing aluminum as a sputtering target. Sputtering current is 100 mA and sputtering time is 100 s to form bright image input. PMMA is whirl-coated at a speed of 4000 r.p.m. on the porous alumina template, and the image disappears immediately. Once the PMMA is removed, the image appears again. As shown in FIG. 4 and FIG. 5, in this embodiment, the design for example is the school badge of Sun Yat-Sen University. The finest lines of the image are approximately 1~4 showing that the minimum pixel of our image is below 4 μm which is much smaller than dozens of minimum pixel of the current normal CCD, so it also can prove that our images have high density imaging characteristics.

The above contents are only preferred embodiments of the present invention, and the present invention is not limited to this. Any modification, equivalent replacement, embellishment and the like made within spirits and principles of the present invention shall be all included in the protection scope of the present invention.

What is claimed is:

1. A preparation method for a reflective image component, comprising:
   a. cleaning of an aluminum sheet: soaking an aluminum sheet with a thickness of more than 0.1 mm in acetone for 5~15 mins; then soaking the aluminum sheet in the 0.5~1.5 mol/L sodium hydroxide solution for 5~15 mins, and finally soaking the aluminum sheet in ethanol for 5~15 mins;
   b. polishing of the aluminum sheet: putting the soaked aluminum sheet into a mixed solution of perchloric acid and ethanol with 15%~35% of perchloric acid to ethanol (v/v), electrochemical polishing the aluminum sheet under a voltage of 10~30 volts for 2~6 mins under 0~4° C.;
   c. a first oxidation of the aluminum sheet: putting the polished aluminum sheet into an electrolyte pool with 0.1~0.3 mol/L oxalic acid; the aluminum sheet is used as an anode and the platinum sheet is used as a cathode; a growth voltage is 30~50 volts, oxidation time is 2~8 hours, and an oxidation temperature is 4~8° C.;
   d. etching of the aluminum sheet: putting the first oxidized aluminum sheet into a mixture of chromic acid, phosphoric acid and water for 60~90 mins under 45~75° C.;
   e. a second oxidation of the aluminum sheet: putting the etched aluminum sheet into the electrolyte pool with 0.1~0.3 mol/L oxalic acid solution, the aluminum sheet is used as an anode and the platinum sheet is used as a cathode, an oxidation voltage is 30~50 volts, the oxidation time is 80~600 s, and the oxidation temperature is 4~8° C.;

f. exposing of an image by photolithography: spin-coating a photoresist in advance on the surface of a porous aluminum template formed after the second oxidation of an aluminum sheet, and then exposing an image by a photolithography system;

g. modulation of a pore diameter of a porous alumina template: putting a photolithography-exposed aluminum template into 0.3 mol/L oxalic acid solution, keeping a temperature at 40~60° C., soaking for 0~360 mins to obtain a porous alumina template with a first pore diameter, then removing the photoresist, and then changing the first pore diameter of the porous alumina template by soaking the porous alumina template into 0.3 mol/L oxalic acid solution, keeping a temperature at 40~60° C., and soaking for 2.5~360 mins to enlarging the first pore diameter into a second pore diameter; and h. sputtering of a thin film: using a metal target material to sputter the thin film on the porous alumina template by a sputtering device, to obtain the reflective image component; a sputtering current is 3~100 mA and sputtering time is 50~300 seconds.

2. The preparation method for a reflective image component according to claim 1, wherein a mass fraction of the chromic acid in the mixture in the step d is 1~3%, a mass fraction of the phosphoric acid in the step d is 4~8% and a balance is water.

3. The preparation method for a reflective image component according to claim 1, wherein a thickness of the porous alumina template in the step f is 200~1000 nm.

4. The preparation method for a reflective image component according to claim 1, wherein the target material provided in the sputtering device in the step h is a gold target, a silver target or an aluminum target.

5. The preparation method for a reflective image component according to claim 1, wherein the sputtered thin film consists of a metallic semi-continuous film, a porous alumina film and a metal substrate.

* * * * *